(12) United States Patent
Fukuoka et al.

(10) Patent No.: US 7,800,299 B2
(45) Date of Patent: Sep. 21, 2010

(54) ORGANIC ELECTROLUMINESCENT DEVICE AND DISPLAY USING SAME

(75) Inventors: Kenichi Fukuoka, Sodegaura (JP); Hiroshi Yamamoto, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 12/591,634

(22) Filed: Nov. 25, 2009

(65) Prior Publication Data

US 2010/0096624 A1 Apr. 22, 2010

Related U.S. Application Data

(63) Continuation of application No. 10/559,433, filed as application No. PCT/JP2004/007605 on Jun. 2, 2004, now Pat. No. 7,659,659.

(30) Foreign Application Priority Data

Jun. 4, 2003 (JP) ............... 2003-159231

(51) Int. Cl.
*H01J 1/62* (2006.01)
*H01L 35/24* (2006.01)

(52) U.S. Cl. ........................ 313/504; 257/40

(58) Field of Classification Search ......... 313/498–512; 315/169.3, 169.4; 257/40, 79; 428/690
See application file for complete search history.

(56) References Cited

U.S. PATENT DOCUMENTS

| 5,130,603 | A | 7/1992 | Tokailin et al. |
| 5,281,489 | A | 1/1994 | Mori et al. |
| 5,343,050 | A | 8/1994 | Syun et al. |
| 6,013,384 | A | 1/2000 | Kido et al. |
| 6,893,743 | B2 | 5/2005 | Sato et al. |
| 2001/0005021 | A1 | 6/2001 | Fukuyama et al. |
| 2005/0123800 | A1* | 6/2005 | Kim et al. .................. 313/504 |
| 2006/0061271 | A1 | 3/2006 | Futagami et al. |
| 2007/0122939 | A1* | 5/2007 | Jeong et al. .................. 257/40 |

(Continued)

FOREIGN PATENT DOCUMENTS

JP 02-195683 8/1990

(Continued)

OTHER PUBLICATIONS

Qiu, Y. et al, "Organic light-emitting diodes with improved hole-electron balance by using copper phthalocyanine/aromatic diamine multiple quantum wells," Applied Physicals Letters, vol. 80, No. 15, Apr. 15, 2002, pp. 2628-2630.

(Continued)

*Primary Examiner*—Peter Macchiarolo
(74) *Attorney, Agent, or Firm*—Steptoe & Johnson LLP

(57) ABSTRACT

An organic electroluminescent device (1) including: an emitting layer (14) between a pair of electrodes that are an anode (12) and a cathode (17), and a suppressing layer arranged between an electrode and the emitting layer (14), the suppressing layer regulating the amount of electrons or holes supplied to the emitting layer (14). For example, the electroluminescent device wherein the electron-injection-suppressing layer (15) or a hole-injection-suppressing layer is formed as the suppressing layer. The organic electroluminescent device is improved in emission efficiency.

9 Claims, 1 Drawing Sheet

U.S. PATENT DOCUMENTS

2008/0318084 A1* 12/2008 Lee et al. .................... 428/690

FOREIGN PATENT DOCUMENTS

| | | |
|---|---|---|
| JP | 02-247278 | 10/1990 |
| JP | 03-231970 | 10/1991 |
| JP | 06-36877 | 2/1994 |
| JP | 08-078163 | 3/1996 |
| JP | 08-222373 | 8/1996 |
| JP | 09-087616 | 3/1997 |
| JP | 09-188487 | 7/1997 |
| JP | 09-286980 | 11/1997 |
| JP | 10-270171 | 10/1998 |
| JP | 11-154596 | 6/1999 |
| JP | 2000-186094 | 7/2000 |
| JP | 2000-243574 | 9/2000 |
| JP | 2001-267080 | 9/2001 |
| JP | 2001-267081 | 9/2001 |
| JP | 2003-068468 | 3/2003 |
| JP | 2004-002297 | 1/2004 |
| JP | 2004-111173 | 4/2004 |
| JP | 2004-119145 | 4/2004 |
| WO | WO 2004/082337 | 9/2004 |
| WO | WO 2004/082338 | 9/2004 |

OTHER PUBLICATIONS

Pyo, S. et al, "White-light-emitting organic electroluminescent devices using new chelate metal complexes," Thin Solid Films, 363 (2000), pp. 232-235.

Fujii, A. et al, "Color-Variable Electroluminescent Diode with Single Quantum Well Structure Utilizing 8-Hydroxyquinoline Aluminum and Aromatic Diamine," Japanese Journal of Applied Physics, vol. 34, 1995, pp. L499-L502.

* cited by examiner

ORGANIC ELECTROLUMINESCENT DEVICE AND DISPLAY USING SAME

REFERENCE TO RELATED APPLICATIONS

This application is a continuation of application Ser. No. 10/559,433 filed Dec. 5, 2005, which is a National Stage of PCT/JP04/007605 filed Jun. 2, 2004, which claims the benefit of Japanese Patent Application No. 2003-159231 filed Jun. 4, 2003.

TECHNICAL FIELD

The invention relates to an organic electroluminescent device and a display using the same.

TECHNICAL BACKGROUND

An organic electroluminescent device (the "electroluminescent" will be referred to as "EL" hereinafter) has the properties of high visibility based on self-emission, excellent impact resistance based on a complete solid device, and the like, so that it attracts attention for its use as an emitting device in various displays.

The organic EL device has an emitting layer interposed between a pair of electrodes consisting of an anode and a cathode. When an electric field is applied between these two electrodes, electrons are injected into the emitting layer from the cathode side, holes are injected into the emitting layer from the anode side, and the electrons and the holes are recombined in the emitting layer to emit light.

As a technique of increasing the efficiency of the organic EL device, there are the technique of doping the emitting layer and the technique of improving a cathode material, and attempts have been made to improve the organic EL device in current efficiency.

On the other hand, a voltage-decreasing technique has been developed for decreasing the power consumption, and a remarkable decrease in the voltage for an organic EL device has been confirmed when an organic material having high mobility of electrons or holes is used.

However, it cannot be easily attained to realize both high current efficiency and a decrease in voltage at the same time. Further, it is very difficult to attain higher lifetime simultaneously.

In particular, an organic EL device for emitting blue light has the above difficulties to a great extent, and various improvements have been carried out, but they cannot be said to be sufficient.

As a technique for higher efficiency and a decrease in voltage, the use of a hole-blocking layer is proposed (e.g., JP-A-2-195683). The hole-blocking layer refers to a layer provided for preventing holes injected into the emitting layer from being diffused in the cathode direction. However, when an emitting layer has a wider gap like blue emission, the ionization potential is large, so that a hole-blocking layer to be combined therewith is required to have a further larger ionization potential. As a result, it is difficult to select a material therefor, and the lifetime of such a layer is often short, so that the hole-blocking layer has not been put to practical use.

For adjusting the ratio of hole blocking, it is required to select different hole-blocking materials, and when emitting layers differ, it is required to select hole-blocking materials to match them, respectively.

Meanwhile, as an electron injecting layer, there are reports on those which have remarkably high electron mobility, and it is confirmed that the use thereof enables an organic EL device to perform at a remarkably decreased voltage (for example, see JP-A-9-087616 and JP-A-9-194487). In this case, however, the quantity of electrons injected into the emitting layer comes to be too large as compared with the quantity of holes, so that electrons pass through the emitting layer at a high ratio in many cases. Therefore, a large amount of the current flows since the current is an addition of flows of holes and electrons. However, the emission amount is not so large. That is, the problem is that no sufficient emission efficiency can be obtained, and there is also involved another problem that the lifetime is short.

In view of these problems, it is an object of the invention to provide an organic EL device improved in emission efficiency.

In particular, it is an object of the invention to provide an organic EL device having high emission efficiency at a low voltage.

DISCLOSURE OF THE INVENTION

For overcoming the above problems, the present inventors have made diligent studies. As a result, it has been found that the current can be efficiently converted to light only when holes and electrons injected into the emitting layer are balanced in quantity. That is, it has been found that when electrons are excessive relative to holes, it is very effective to balance holes and electrons by suppressing excess electrons. While a remarkably excellent material is used for the emitting layer, if holes and electrons are not so balanced as described above, the material cannot exhibit its sufficient performance.

However, it requires delicate adjustments to balance holes and electrons. The conductivity of an organic material differs from those of metal and semiconductor and hence does not go along with the Ohm's law. The organic material has characteristics that the current flows sharply at a threshold voltage, and the current is in proportion to the exponent of the voltage. Generally, the current flowing in an insulating material such as an organic material is said to be a space charge limited current. Since holes and electrons are generally not alike with regard to the above characteristic, it is very difficult to balance holes and electrons.

For attaining the above delicate balance, studies have to be made on combinations of various materials for holes and electrons for adjusting the balance, and combinations of a vast quantity of materials have to be studied therefor, so that it takes a long time.

On the other hand, the adjustment by a material change is carried out by changing the molecular structure of the material. However, it is generally difficult to change only to some extent for attaining the mobility as required.

The present inventors have therefore found that the quantity balance of holes and electrons to be injected into the emitting layer can be easily adjusted by forming a hole- or electron-injection-suppressing layer between an electrode and the emitting layer.

That is, according to the invention, there is provided an organic EL device having an emitting layer between an anode and a cathode as a pair of electrodes, the organic EL device having a suppressing layer formed for adjusting the quantity of electrons or holes to be injected into the emitting layer between one of the electrodes and the emitting layer.

In this device, the quantity balance between holes and electrons to be injected into the emitting layer can be adjusted with the suppressing layer, so that the emitting material can be allowed to exhibit its performance to a maximum extent. It is therefore not required to change materials for the hole injecting layer, the electron injecting layer, etc., for controlling the balance between holes and electrons, and the balance can be relatively easily controlled, so that the above technique is remarkably excellent as a practical one.

Specifically, when the quantity of electrons injected into the emitting layer is excessive relative to that of holes, the electron injecting layer and an electron-injection-suppressing layer having smaller electron mobility than the electron injecting layer are provided between the cathode and the emitting layer, whereby the quantity of electrons to be injected to the emitting layer is suppressed for adjusting the balance thereof with holes.

For example, a material of which only an electron injecting layer made causes excess electrons and a material of which only an electron-injection-suppressing layer made causes excess holes are selected, the electron-injection-suppressing layer is interposed between the electrode and the emitting layer, and the thickness thereof is increased little by little from 0. In this case, holes and electrons are balanced in quantity when a certain thickness is reached, and the current efficiency reaches a maximum value.

In the invention, the quantity of electrons to be injected can be thus adjusted in a stepless manner by only changing the thickness of the electron-injection-suppressing layer.

Similarly, when holes are excessive in quantity, the hole injecting layer and a hole-injection-suppressing layer having smaller hole mobility than the hole injecting layer are provided between the anode and the emitting layer, whereby the quantity of holes to be injected into the emitting layer is suppressed for adjusting the balance thereof with electrons.

The invention is a technique remarkably effective for blue emission. A material that emits light in blue has a relatively high energy, and the energy gap thereof is relatively large. Therefore, when recombination in the emitting layer is concentrated in the interface of the hole transporting layer and the emitting layer combined, the difference between the emitting layer and the hole transporting layer in affinity level tends to become small, and electrons are liable to enter the hole transporting layer from the emitting layer. As compared with emission in any different color, therefore, it is required to finely control the injection balance of holes and electrons.

The emitting layer is doped in many cases, and the carrier balance can be changed with a dopant. In the emitting layer that emits light in blue, however, the dopant does not intensively work as a trap, so that it is very difficult to improve the balance by means of only the dopant when the quantity of electrons is excessive.

In contrast, the invention carries out balance adjustment on the basis of the thickness of the electron-injection-suppressing layer, and has an excellent advantage that it can be applied regardless of what the material of the emitting layer is.

The interposing of the above suppressing layer is very effective since the balance between holes and electrons can be improved by the relatively easy method, and it is powerful and remarkably superior as a practical technique due to its simplicity and easiness.

The present Applicant has also proposed a novel nitrogen-containing cyclic compound for an electron-injecting layer having remarkably high electron mobility (Japanese Patent Application No. 2003-004193).

When the above material having high electron mobility and the electron-injection-suppressing layer of the invention are combined, there can be realized an organic EL device having high emission efficiency at a low voltage.

The organic EL device of the invention can be applied to display screens of various displays such as a consumer TV set, a large display, a cellular phone display screen, and the like.

PREFERRED EMBODIMENTS OF THE INVENTION

The invention will be explained in detail hereinafter.

First, the organic EL device of the invention will be explained with reference to the drawings.

Figure 1:
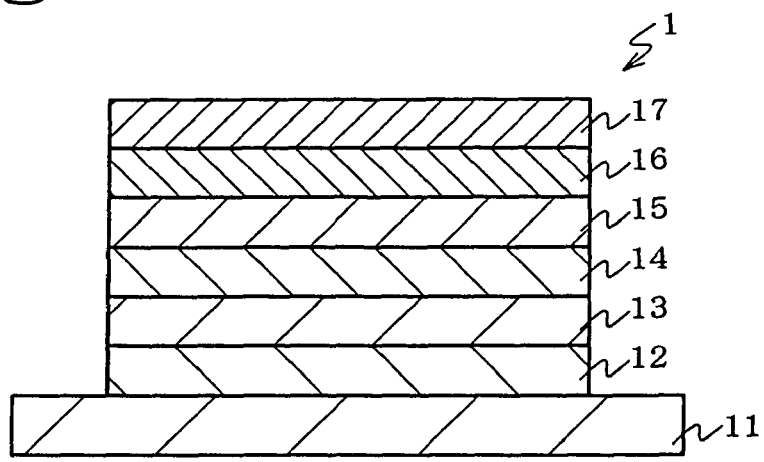
FIG. 1 is a cross-sectional view of an organic EL device as one embodiment of the invention.
Figure 2:
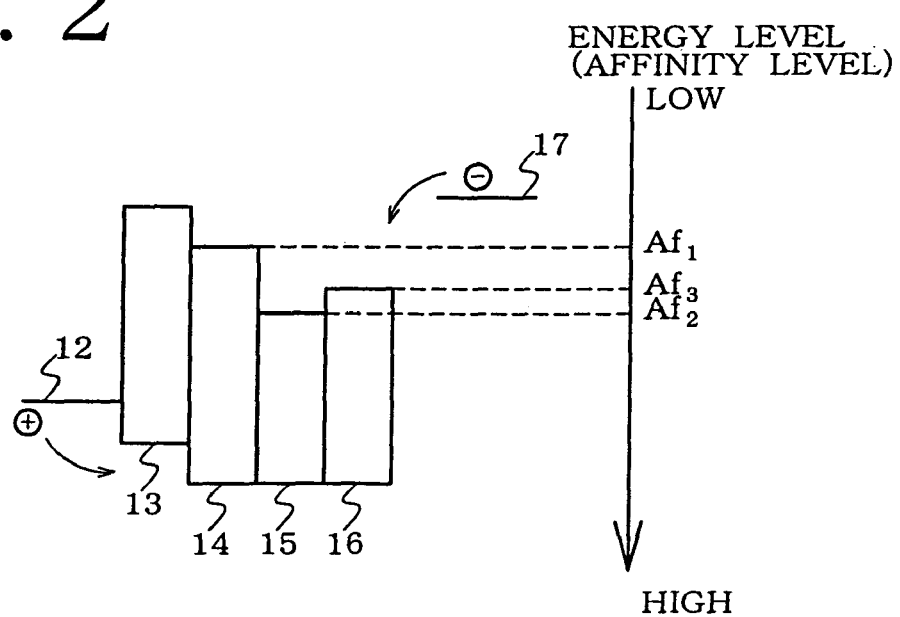
FIG. 2 is an energy diagram of an organic EL device as one embodiment of the invention.

FIG. 1 is a cross-sectional view of an organic EL device as one embodiment of the invention, and FIG. 2 is an energy diagram of the organic EL device.

This embodiment is an example in which the electron-injection-suppressing layer is provided since the quantity of electrons supplied from the electron injecting layer is larger than that of holes injected from the hole injecting layer.

As a combination of such materials, there is a combination of ET1 for the electron injecting layer, α-NPD for the hole injecting layer and Alq for the electron-injection-suppressing layer. These materials have chemical formulae as shown below.

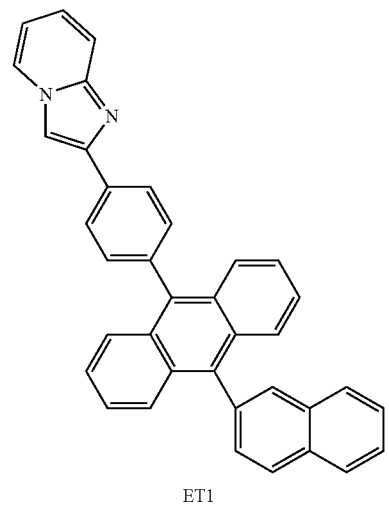

ET1

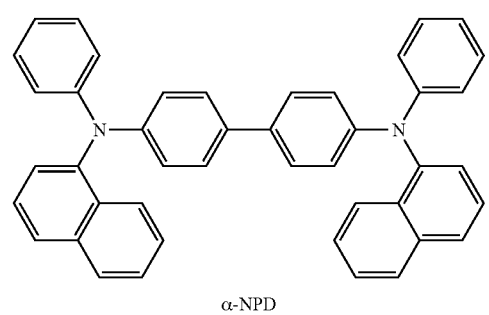

α-NPD

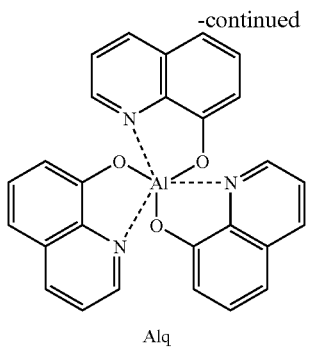

Alq

An organic EL device 1 has a structure in which an anode 12, a hole injecting layer 13, an emitting layer 14, an electron-injection-suppressing layer 15, an electron injecting layer 16 and a cathode 17 are stacked on a substrate 11 in this order.

The substrate 11 is a substrate for supporting the organic EL device. The anode 12 works to inject holes into the hole injecting layer 13 or the emitting layer 14. The hole injecting layer 13 is a layer that works as an aid in the injection of holes into the emitting layer 14 and transports them to an emitting region. The emitting layer 14 mainly provides a site for recombination of electrons and holes so as to emit light. The electron-injection-suppressing layer 15 is a layer for adjusting the injection of electrons into the emitting layer 14 to attain a balance between the electrons and holes. The electron injecting layer 16 is a layer that works as an aid in the injection of electrons into the emitting layer 14. The cathode 17 works to inject electrons into the electron injecting layer 16 or the emitting layer 14.

In this embodiment, the function to inject electrons into the emitting layer 14 is required to be lower than that of the electron injecting layer 16 for causing the electron-injection-suppressing layer 15 to exhibit its function.

Examples of such an electron-injection-suppressing layer include a layer having lower electron mobility, or having a higher affinity level, than the electron injecting layer 16.

The electron mobility refers to a ratio of an applied electric field and the speed of electrons, and with an increase in the intensity of the electric field, the speed of electrons is increased, and the current becomes large.

In an organic EL device in which the total thickness of the electron-injection-suppressing layer 15 and the electron injecting layer 16 is constant, when a constant voltage is applied while changing the thickness ratio of the electron-injection-suppressing layer 15 to the electron injecting layer 16, the electric field occurring in the electron injecting layer 16 can be made small as compared with a case where the electron-injection-suppressing layer 15 is absent, by interposing a material having small mobility as the electron-injection-suppressing layer 15. Further, with an increase in the thickness of the electron-injection-suppressing layer 15, the electric field that occurs in the electron injecting layer 16 becomes smaller.

Therefore, the electric field of the electron injecting layer 16 can be controlled on the basis of the thickness of the electron-injection-suppressing layer 15, and the current caused by electrons, that is, the quantity of electrons to be injected into the emitting layer 14 can be adjusted.

Further, the balance between holes and electrons to be injected into the emitting layer 14 can also be adjusted by adjusting the affinity levels of the emitting layer 14, the electron-injection-suppressing layer 15 and the electron injecting layer 16.

The affinity level refers to the level of conduction level of electrons of each layer in the energy diagram shown in FIG. 2, and it corresponds to the energy level of LUMO (lowest unoccupied molecular orbital) of constituting molecules.

When the affinity level Af2 of the electron-injection-suppressing layer 15 is greater than the affinity level Af1 of the emitting layer 14 and the affinity level Af2 of the electron-injection-suppressing layer 15 is greater than, or equal to, the affinity level Af3 of the electron injecting layer 16, that is, when Af1<Af2 and Af3≦Af2 are satisfied, there is only an injection barrier by a difference in the affinity levels to the injection of electrons into the emitting layer 14 from the electron-injection-suppressing layer 15.

The thus-formed injection barrier can control the injection of electrons into the emitting layer 14.

The adjustment of quantity of electrons to be injected into the emitting layer 14 can also be made by adjusting one of the electron mobility and the affinity level, or may be made on the basis of both of these.

In addition to the above, examples of the constitution of the organic EL device of the invention include i) anode/emitting layer/electron-injection-suppressing layer/electron injecting layer/cathode, ii) anode/hole injecting layer/hole transporting layer/emitting layer/electron-injection-suppressing layer/electron injecting layer/cathode, iii) anode/hole injecting layer/hole transporting layer/emitting layer/electron-injection-suppressing layer/electron transporting layer/electron injecting layer/cathode, iv) anode/hole injecting layer/hole transporting layer/emitting layer/electron transporting layer/electron-injection-suppressing layer/electron injecting layer/cathode, v) anode/hole injecting layer/hole transporting layer/emitting layer/electron transporting layer/electron-injection-suppressing layer/electron injecting layer/adhesion improving layer/cathode, vi) anode/organic semiconductor layer/emitting layer/electron-injection-suppressing layer/electron injecting layer/cathode, vii) anode/organic semiconductor layer/hole injecting layer/emitting layer/electron-injection-suppressing layer/electron injecting layer/cathode, vii) anode/organic semiconductor layer/hole injecting layer/hole transporting layer/emitting layer/electron-injection-suppressing layer/electron injecting layer/cathode, ix) anode/organic semiconductor layer/hole injecting layer/hole transporting layer/emitting layer/electron-injection-suppressing layer/electron transporting layer/electron injecting layer/cathode, x) anode/insulating layer/emitting layer/electron-injection-suppressing layer/electron injecting layer/cathode, and xi) anode/inorganic semiconductor layer/insulating layer/emitting layer/electron-injection-suppressing layer/electron injecting layer/cathode.

Each layer constituting the organic EL device of the invention will be explained below.

In addition, another organic layer or inorganic layer may be interposed between the above layers so long as the function and effect of the invention are not impaired.

Further, when the quantity of holes injected into the emitting layer is greater than electrons, a hole-injection-suppressing layer is formed between the anode and the emitting layer in the above constitution in place of the electron-injection-suppressing layer.

(1) Transparent Substrate

The organic EL device of the invention is formed on a transparent substrate. The transparent substrate is a substrate for supporting the organic EL device, and is preferably a flat or smooth substrate having a transmittance of 50% or more to visible light of 400 to 700 nm.

Specific examples thereof include a glass plate and a polymer plate. Examples of the glass plate include soda-lime glass, barium/strontium-containing glass, lead glass, aluminosilicate glass, borosilicate glass, barium borosilicate glass, and quartz. Examples of the polymer plate include polycarbonate, acrylic polymer, polyethylene terephthalate, polyethersulfide, and polysulfone.

(2) Anode

The anode of the organic thin film EL element plays a role for injecting holes into its hole transporting layer or emitting layer. The anode effectively has a work function of 4.5 eV or more. Specific examples of the material of the anode used in the invention include indium tin oxide alloy (ITO), indium zinc oxide (IZO), tin oxide (NESA), gold, silver, platinum, and copper.

The anode can be formed by forming these electrode materials into a thin film by vapor deposition, sputtering or the like.

In the case where luminescence from the emitting layer is taken out through the anode, the transmittance of the anode to the luminescence is preferably more than 10%. The sheet resistance of the anode is preferably several hundreds $\Omega/\square$ or less. The film thickness of the anode, which varies depending on the material thereof, is usually from 10 nm to 1 µm, preferably from 10 to 200 nm.

(3) Hole Injecting, Transporting Layer

The hole injecting, transporting layer is a layer for helping the injection of holes into the emitting layer so as to transport the holes to a light emitting region. The hole mobility thereof is large and the ionization energy thereof is usually as small as 5.5 eV or less. Such a hole injecting, transporting layer is preferably made of a material which can transport holes to the emitting layer at a lower electric field intensity. The hole mobility thereof is preferably at least $10^{-4}$ cm$^2$/V·second when an electric field of, e.g., $10^4$ to $10^6$ V/cm is applied.

The material for forming the hole injecting, transporting layer is not particularly limited so long as the material has the above-mentioned preferred natures. The material can be arbitrarily selected from materials which have been widely used as a hole transporting material in photoconductive materials and known materials used in a hole injecting layer of EL devices.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrozoline derivatives and pyrozolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232, 103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stylbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive macromolecular oligomers (in particular thiophene oligomers) disclosed in JP-A-1-211399.

The above-mentioned substances can be used as the material of the hole injecting layer. The following is preferably used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), in particular, the aromatic tertiary amine compounds.

The following can also be given as examples: 4,4'-bis(N-(1-naphthyl)-N-phenylamino)biphenyl (hereinafter abbreviated to NPD), which has in the molecule thereof two condensed aromatic rings, disclosed in U.S. Pat. No. 5,061,569, and 4,4',4"-tris(N-(3-methylphenyl)-N-phenylamino)triphenylamine (hereinafter abbreviated to MTDATA), wherein three triphenylamine units are linked to each other in a starburst form, disclosed in JP-A-4-308688.

Inorganic compounds, such as p-type Si and p-type SiC, as well as the above-mentioned aromatic dimethylidene type compounds can also be used as the material of the hole injecting layer.

The hole injecting, transporting layer can be formed by making the above-mentioned compound(s) into a thin film by a known method, such as vacuum deposition, spin coating, casting or LB technique. The thickness of the hole injecting, transporting layer is not particularly limited, and is usually from 5 nm to 5 µm. This hole injecting, transporting layer may be a single layer made of one or more out of the above-mentioned materials if this layer contains the compound of the invention in its hole transporting zone. A hole injecting, transporting layer made of a compound different from that in the above-mentioned hole injecting, transporting layer may be stacked thereon.

The organic semiconductor layer is a layer for helping the injection of holes or electrons into the emitting layer, and is preferably a layer having an electroconductivity of $10^{-10}$ S/cm or more. The material of such an organic semiconductor layer may be an electroconductive oligomer, such as thiophene-containing oligomer or arylamine-containing oligomer disclosed in JP-A-8-193191, and an electroconductive dendrimer such as arylamine-containing dendrimer.

(4) Hole-Injection-Suppressing Layer

The material used in the hole-injection-suppressing layer is a material suppressing the injection of holes, not a material blocking the injection of holes. As such a material, there can be used materials which have conventionally been used in a hole injecting layer and of which the hole mobility or the ionization potential is smaller than that of a hole injecting layer used in the organic EL device of the invention.

Specifically, preferred are diamine compounds disclosed in JP-A-5-234678, JP-A-5-320634, JP-A-6-220437, JP-B-2686418, JP-B-2924809, JP-A-7-138562, JP-A-11-54280 and JP-A-7-157454, and amine derivatives disclosed in JP-A-10-316658, EP-0650955A1, JP-A-2002-249765, JP-A-3-111485 and JP-A-6-312981.

(5) Emitting Layer

The emitting layer has the following functions:

(i) Injecting function: a function capable of injecting holes into the layer from an anode or a hole injecting layer, and injecting electrons into the layer from a cathode or an electron injecting layer when an electric field is applied.

(ii) Transporting function: a function of transporting the injected charges (electrons and holes) by the electric field.

(iii) Light emitting functions: a function of supplying a field where the electrons and the holes are recombined and inducing light emission from this recombination.

There may be a difference in ease of injection between holes and electrons. There may also be a difference between transport abilities of holes and electrons represented by mobilities of holes and electrons. However moving one of charges is preferred.

The host materials used in the emitting layer may be a material known as a luminescent material having a long durability. It is preferred to use, as the host material of the luminescent material, a material represented by a general formula [1]. However, it is not necessarily limited to the following material.

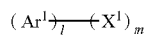

[1]

wherein $Ar^1$ is an aromatic ring with 6 to 50 nucleus carbon atoms, $X^1$ is a substituent, l is integer of 1 to 5, and m is an integer of 0 to 6, provided that $Ar^1$s may be the same as or different from each other when l is 2 or more, and $X^1$s may be the same as or different from each other when m is 2 or more. l is preferably 1 to 2 and m is preferably 0 to 4.

Specific examples of the aromatic ring $Ar^1$ include phenyl, naphthyl, anthracene, biphenylene, azulene, acenaphthylene, fluorene, phenanthrene, fluoranthene, acephenanthrylene, triphenylene, pyrene, chrysene, naphthacene, picene, perylene, penthaphene, pentacene, tetraphenylene, hexaphene, hexacene, rubicene, coronene, and trinaphthylene rings.

Preferred examples thereof include phenyl, naphthyl, anthracene, acenaphthylene, fluorene, phenanthrene, fluoranthene, triphenylene, pyrene, chrysene, perylene, and trinaphthylene rings.

More preferred examples thereof include phenyl, naphthyl, anthracene, fluorene, phenanthrene, fluoranthene, pyrene, chrysene, and perylene rings.

Specific examples of $X^1$ include substituted or unsubstituted aromatic groups with 6 to 50 nucleus carbon atoms, substituted or unsubstituted aromatic heterocyclic groups with 5 to 50 nucleus carbon atoms, substituted or unsubstituted alkyl groups with 1 to 50 carbon atoms, substituted or unsubstituted alkoxy groups with 1 to 50 carbon atoms, substituted or unsubstituted aralkyl groups with 1 to 50 carbon atoms, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbon atoms, substituted or unsubstituted styryl groups, halogen groups, a cyano group, a nitro group, and a hydroxyl group.

Examples of the substituted or unsubstituted aromatic groups with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted aromatic heterocyclic groups with 5 to 50 nucleus carbon atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl; 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

Examples of the substituted or unsubstituted alkyl groups with 1 to 50 carbon atoms include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, cyclopropyl, cyclobutyl, cyclopentyl, cyclohexyl, 4-methylcyclohexyl, 1-adamanthyl, 2-adamanthyl, 1-norbornyl, and 2-norbornyl groups.

The substituted or unsubstituted alkoxy groups with 1 to 50 carbon atoms are groups represented by —OY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted aralkyl groups with 1 to 50 carbon atoms include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl groups.

The substituted or unsubstituted aryloxy groups with 5 to 50 nucleus atoms are represented by —OY'. Examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted arylthio groups with 5 to 50 nucleus atoms are represented by —SY", and examples of Y" include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted carboxyl groups with 1 to 50 carbon atoms are represented by —COOZ, and examples of Z include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted styryl groups include 2-phenyl-1-vinyl, 2,2-diphenyl-1-vinyl, and 1,2,2-triphenyl-1-vinyl groups.

Examples of the halogen groups include fluorine, chlorine, bromine and iodine.

A dopant may be added to the emitting layer. The dopant used in the emitting layer may each be a dopant known as a luminescent material having a long durability. It is preferred to use, as the dopant material of the luminescent material, a material represented by a general formula [2]. However, it is not necessarily limited to the following material.

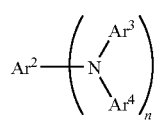

[2]

wherein $Ar^2$ to $Ar^4$ may be the same as or different from each other, and are each a substituted or unsubstituted aromatic group with 6 to 50 nucleus carbon atoms, or a substituted or unsubstituted styryl group; and n is an integer of 1 to 4; provided that $Ar^3$s, as well as $Ar^4$s, may be the same as or different from each other when n is 2 or more.

Examples of the substituted or unsubstituted aromatic group with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted styryl group include 2-phenyl-1-vinyl, 2,2-diphenyl-1-vinyl, and 1,2,2-triphenyl-1-vinyl groups.

As the method for forming the emitting layer, a known method such as vapor deposition, spin coating or LB technique can be used. The emitting layer is preferably a molecule-deposited film.

The molecule-deposited film is a thin film formed by precipitation and deposition from an ingredient compound in a gas phase state or a film formed by solidification from an ingredient compound in a solution state or a liquid phase state. This molecule-deposited film can be usually distinguished from the thin film formed by LB technique (the molecule-accumulated film) by difference in aggregation structure or high-order structure, or in functional difference resulting therefrom.

As disclosed in JP-A-S57-51781, the emitting layer can be formed by dissolving a binder, such as resin, and an ingredient compound into a solvent to prepare a solution and then making this into a thin film by spin coating or the like.

(6) Electron-Injection-Suppressing Layer

The material used in the electron-injection-suppressing layer is a material suppressing the injection of electrons, not a material blocking the injection of electrons. As such a material, there can be used materials which have conventionally been used in an electron injecting layer, and of which the electron mobility is smaller or of which the affinity level is larger than that of an electron injecting layer used in the organic EL device of the invention.

As such a material, for example, a metal complex of 8-hydroxyquinoline or its derivatives is preferred. Specific examples include metal chelate oxynoid compounds containing a chelate of oxine (generally, 8-quinolinol or 8-hydroxyquinoline). For example, (8-quinolinolato)aluminum complex (Alq) can be used.

The electron-injection-suppressing layer is preferably made of a heterocyclic derivative; heterocyclic compounds formed by condensed six-membered ring and five-membered ring such as imidazole or imidazopyrazine derivatives. Nitrogen-containing cyclic compounds, silicon-containing cyclic compounds and boron-containing compounds, which can be used in an electron injecting layer described later, can also be preferably used.

It is important that the electron mobility of the electron-injection-suppressing layer is smaller than that of the electron injecting layer, or the affinity level (Af2) of the electron-injection-suppressing layer is larger than the affinity level (Af1) of the emitting layer and the affinity level (Af2) of the electron-injection-suppressing layer is larger than or equal to the affinity level (Af3) of the electron injecting layer, that is to say, to satisfy the following relationship, Af1<Af2, Af3≦Af2.

(7) Electron Transporting Layer

Examples of the semiconductor constituting the electron transporting layer may be one or any combination of two or more out of oxides, nitrides or oxynitrides containing at least one of Ba, Ca, Sr, Yb, Al, Ga, In, Li, Na, Cd, Mg, Si, Ta, Sb and Zn. The inorganic compound constituting the electron transporting layer preferably forms a microcrystalline or amorphous insulator thin film. If the electron transporting layer is made of the insulator thin film, the thin film becomes a more uniform thin film. Therefore, pixel defects such as dark spots can be decreased. Examples of such an inorganic compound include the above-mentioned alkali metal calcogenides, alkaline earth metal calcogenides, halides of alkali metals, and halides of alkaline earth metals.

(8) Electron Injecting Layer

The electron injecting layer is a layer for helping the injection of electrons into the emitting layer, and has a large electron mobility.

In order to enhance adhesion to the cathode, an adhesion improving layer may be provided in addition to the electron injecting layer.

As the material of the electron injecting layer, nitrogen-containing cyclic compounds, silicon-containing cyclic compounds and boron-containing compounds shown below may preferably be used.

For the nitrogen-containing cyclic compounds, compounds represented by the following formulas [3] to [17] are preferred.

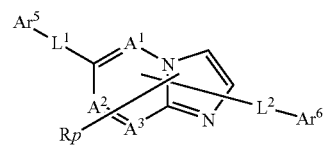

[3]

wherein $A^1$ to $A^3$ is a nitrogen atom or carbon atom; R is an aryl group which has 6 to 60 carbon atoms and may have a substituent, a heteroaryl group which has 3 to 60 carbon atoms and may have a substituent, an alkyl group which has 1 to 20 carbon atoms, a haloalkyl group which has 1 to 20 carbon atoms, or an alkoxy group which has 1 to 20 carbon atoms; p is an integer of 0 to 5 and when p is an integer of 2 or more, Rs may be the same as or different from each other or Rs adjacent to each other may be bonded to each other to form a substituted or unsubstituted carbocyclic aliphatic ring or a substituted or unsubstituted carbocyclic aromatic ring; $Ar^5$ is an aryl group which has 6 to 60 carbon atoms and may have a substituent, or a heteroaryl group which has 3 to 60 carbon atoms and may have a substituent; $Ar^6$ is a hydrogen atom, an alkyl group which has 1 to 20 carbon atoms, a haloalkyl group which has 1 to 20 carbon atoms, an alkoxy group which has 1 to 20 carbon atoms, an aryl group which has 6 to 60 carbon atoms and may have a substituent, or a heteroaryl group which has 3 to 60 carbon atoms and may have a substituent (provided that either one of $Ar^5$ and $Ar^6$ is a condensed cyclic group which has 10 to 60 carbon atoms and may have a substituent or a condensed heterocyclic group which has 3 to 60 carbon atoms and may have a substituent); $L^1$ and $L^2$ are each a single bond, a condensed cyclic group which has 6 to 60 carbon atoms and may have a substituent, a condensed heterocyclic group which has 3 to 60 carbon atoms and may have a substituent, or a fluorenylene group which may have a substituent.

The compound of the formula [3] can be synthesized by a method described in Japanese Patent Application No. 2003-005184.

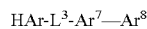

[4]

wherein HAr is a nitrogen-containing heterocyclic ring which has 3 to 40 carbon atoms and may have a substituent, $L^3$ is a single bond, an arylene group which has 6 to 60 carbon atoms and may have a substituent, a heteroarylene group which has 3 to 60 carbon atoms and may have a substituent, or a fluorenylene group which may have a substituent, $Ar^7$ is a bivalent aromatic hydrocarbon group which has 6 to 60 carbon atoms and may have a substituent, $Ar^8$ is an aryl group which has 6 to 60 carbon atoms and may have a substituent or a heteroaryl group which has 3 to 60 carbon atoms and may have a substituent.

The compound of the above-mentioned formula [4] can be synthesized by a method described in Japanese Patent Application No. 2003-004139.

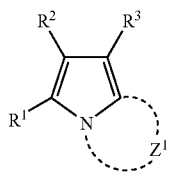

[5]

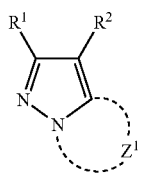

[6]

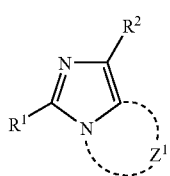

[7]

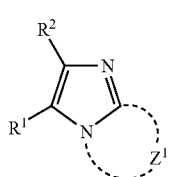

[8]

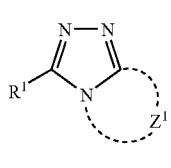

[9]

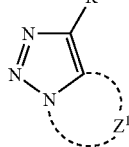

[10]

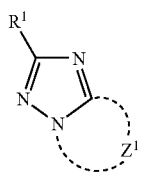

[11]

wherein $R^1$, $R^2$ and $R^3$ are each a hydrogen atom or a substituent, and $Z^1$ represents atoms required to form a five-membered or six-membered ring.

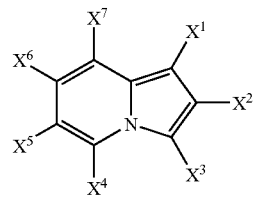

[12]

wherein $X^1$ to $X^7$ are each independently hydrogen, halogen, straight, branch or cyclic alkyl, straight, branch or cyclic alkoxy, substituted or unsubstituted aralkyl, substituted or unsubstituted aryl, substituted or unsubstituted aralkyloxy, substituted or unsubstituted aryloxy or, substituted or unsubstituted alkenyl; and adjacent substituents selected from $X^1$ and $X^2$, $X^2$ and $X^3$, $X^4$ and $X^5$, $X^5$ and $X^6$, and $X^6$ and $X^7$ may be bonded to each other to form a substituted or unsubstituted carbocyclic aliphatic ring, or substituted or unsubstituted carbocyclic aromatic ring with substituted carbon atoms.

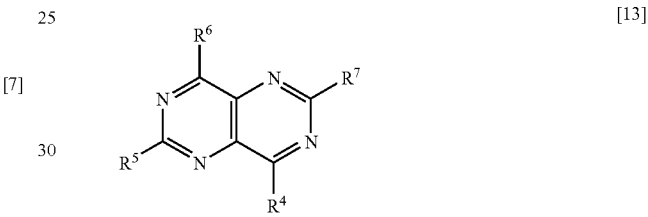

[13]

wherein $R^4$ to $R^7$ are each independently a hydrogen atom, a halogen atom or a group represented by the following formula [14].

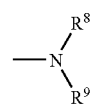

[14]

wherein $R^8$ and $R^9$ are each independently a hydrogen atom, an alkyl group, an aryl group, or an atom or a group which form a cycloalkyl or heterocyclic group when $R^8$ and $R^9$ are joined together.

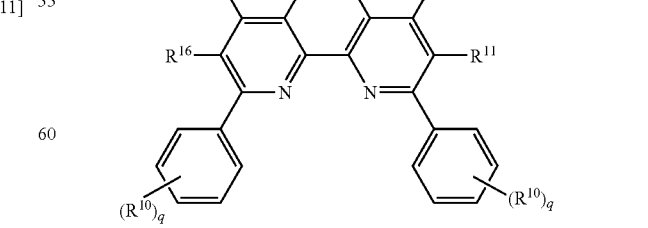

[15]

wherein $R^{10}$ is hydrogen, hydroxyl, amino, lower alkyl which may have a substituent, alkylamino which may have a substituent, alkoxy which may have a substituent, or aromatic hydrocarbon which may have an substituent; q is an integer of 1 to 5; $(R^{10})_q$ shows that the number q of $R^{10}$, which may be the same as or different from each other, are bonded; and $R^{11}$ to $R^{16}$, which may be the same as or different from each other, are hydrogen, halogen, cyano, lower alkyl which may have a substituent, alkylamino which may have a substituent, alkoxy which may have a substituent, or aromatic hydrocarbon which may have a substituent.

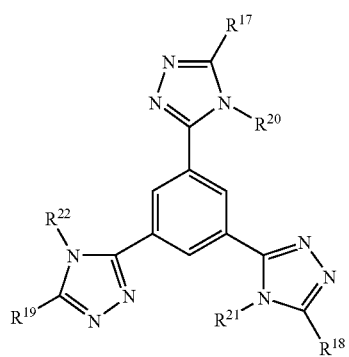

[16]

wherein $R^{17}$ to $R^{22}$ are the same as or different from each other and are each a hydrogen atom, a halogen atom, an alkyl group, an alkoxy group and an aryl group which may have a substituent.

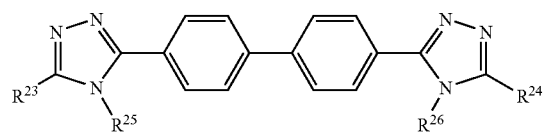

[17]

wherein $R^{23}$ to $R^{26}$ are the same as or different from each other and are each a hydrogen atom, a halogen atom, an alkyl group, an alkoxy group, or an aryl group which may have a substituent.

The silicon-containing cyclic compounds are preferably a compound represented by the following formula [18].

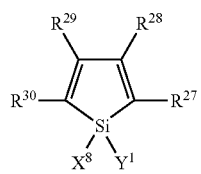

[18]

wherein $X^8$ and $Y^1$ are each a substituted or unsubstituted hydrocarbon group with 1 to 6 carbon atoms, an alkoxy group, an alkenyloxy group, an alkynyloxy group, a hydroxyl group, a substituted or unsubstituted aryl group, or a substituted or unsubstituted heterocyclic group, or $X^8$ or $Y^1$ are bonded to each other to form a substituted or unsubstituted ring; $R^{27}$ to $R^{30}$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoil group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group, a cyano group, or a substituted or unsubstituted condensed ring structure formed by adjacent substituents of $R^{27}$ to $R^{30}$: however, in the case where $R^{27}$ and $R^{30}$ are a phenyl group, $X^8$ and $Y^1$ are neither an alkyl group nor a phenyl group; in the case where $R^{27}$ and $R^{30}$ are a thienyl group, $X^8$, $Y^1$, $R^{28}$ and $R^{29}$ do not form the structure where $X^8$ and $Y^1$ are a monovalent hydrocarbon group, and at the same time $R^{28}$ and $R^{29}$ are an alkyl group, an aryl group, an alkenyl, or an aliphatic group with a cycle formed by $R^{28}$ and $R^{29}$ bonded; in the case where $R^{27}$ and $R^{30}$ are a silyl group, $R^{28}$, $R^{29}$, $X^8$ and $Y^1$ are each neither a monovalent hydrocarbon group with 1 to 6 carbon atoms nor a hydrogen atom; and in the case where $R^{27}$ and $R^{28}$ are bonded to form a condensed structure with a benzene ring, $X^8$ and $Y^1$ are neither an alkyl group nor a phenyl group.

The boron compound is preferably a compound represented by the following formula [19].

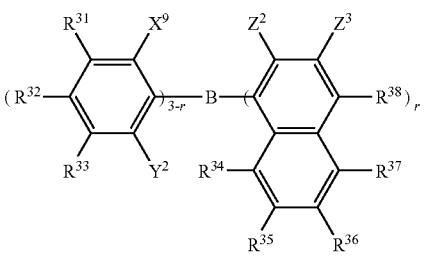

[19]

wherein $R^{31}$ to $R^{38}$ and $Z^3$ are each a hydrogen atom, a saturated or unsaturated hydrocarbon group, an aromatic group, a heterocyclic group, a substituted amino group, a substituted boryl group, an alkoxy group or an aryloxy group; $X^9$, $Y^2$ and $Z^2$ are each a saturated or unsaturated hydrocarbon group, an aromatic group, a heterocyclic group, a substituted amino group, an alkoxy group or an aryloxy group; the substituents of $Z^2$ and $Z^3$ may be bonded to each other to form a condensed ring; r is an integer of 1 to 3, and $Z^2$s may be different from each other when r is 2 or more; however excluded are the compound where r is 1, $X^9$, $Y^2$ and $R^{32}$ are a methyl group and $R^{38}$ is a hydrogen atom or substituted boryl group, and the compound where r is 3 and $Z^2$ is a methyl group.

Another compound represented by the following formula [20] can be used in an electron injecting layer.

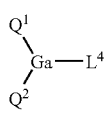

[20]

wherein $Q^1$ and $Q^2$ are a ligand represented by the following general formula [21] and include, but not limited to, quinoline residues such as 8-hydroxy-quinoline and 2-methyl-8-hydroxy-quinoline; $L^4$ is a halogen atom, a substituted or unsubstituted alkyl group, a substituted or unsubstituted cycloalkyl group, a substituted or unsubstituted aryl group, a substituted or unsubstituted heterocyclic group or —O—Ga-$Q^3(Q^4)$ wherein $Q^3$ and $Q^4$ are the same legand as $Q^1$ and $Q^2$.

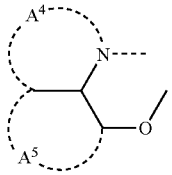

[21]

wherein rings $A^4$ and $A^5$ are each bonded to each other to form a substituted or unsubstituted arylic ring or a substituted or unsubstituted heterocyclic ring.

Specific examples of the rings $A^4$ and $A^5$ include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenyl and 3-trifluoromethylphenoxy; substituted or unsubstituted alkylthio groups such as methythio, ethylthio, tert-butylthio, hexylthio, octylthio and trifruoromethyltio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group, an amino group; mono or di-substituted amino groups such as methylamino, diethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl.

Moreover the above-mentioned substitutes may be bonded to each other to form a six-membered aryl or heterocyclic ring.

In the invention, an electron injecting layer made of an insulator or a semiconductor may be further formed between its cathode and organic layer. At this time, leakage of electric current is effectively prevented so that the electron injecting property can be improved. It is preferred to use, as such an insulator, at least one metal compound selected from the group consisting of alkali metal calcogenides, alkaline earth metal calcogenides, halides of alkali metals, and halides of alkaline earth metals. It is preferred that the electron injecting layer is made of one or more out of these alkali metal calcogenides and the like since the electron injecting property thereof can be further improved. Specifically, preferred examples of the alkali metal calcogenides include $Li_2O$, LiO, $Na_2S$, $Na_2Se$ and NaO. Preferred examples of the alkaline earth metal calcogenides include CaO, BaO, SrO, BeO, BaS, and CaSe. Preferred examples of the halides of alkali metals include LiF, NaF, KF, LiCl, KCl, and NaCl. Preferred examples of the halides of alkaline earth metals include fluorides such as $CaF_2$, $BaF_2$, $SrF_2$, $MgF_2$, and $BeF_2$; and halides other than fluorides.

In the invention, a reducing dopant is preferably contained in an interfacial region between its electron transferring region or cathode, and its organic layer.

The reducing dopant is defined as a substance which can reduce an electron transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

The reducing dopant preferably has a work function of 2.9 eV or less, and includes at least one alkali metal selected from the group consisting of Na (work function: 2.36 eV), K (work function: 2.28 eV), Rb (work function: 2.16 eV) and Cs (work function: 1.95 eV), and at least one alkaline earth metal selected from the group consisting of Ca (work function: 2.9 eV), Sr (work function: 2.0 to 2.5 eV), and Ba (work function: 2.52 eV).

Among these, a more preferable reducing dopant is at least one alkali metal selected from the group consisting of K, Rb and Cs. Even more preferable is Rb or Cs. Most preferable is Cs. These alkali metals are particularly high in reducing ability. Thus, the addition of a relatively small amount thereof to an electron injecting zone makes it possible to improve the luminance of the organic EL device and make the durability thereof long.

As the reducing dopant having a work function of 2.9 eV or less, any combination of two or more out of these alkali metals is also preferred. Particularly preferred is any combination containing Cs, for example, a combination of Cs and Na, Cs and K, Cs and Rb, or Cs, Na and K. The combination containing Cs makes it possible to exhibit the reducing ability efficiently. The luminance of the organic EL device can be improved and the durability thereof can be made long by the addition thereof to its electron injecting zone.

(9) Cathode

For the cathode, the following may be used: an electrode substance made of a metal, an alloy or an electroconductive compound, or a mixture thereof which has a small work function (4 eV or less). Specific examples of the electrode substance include sodium, sodium-potassium alloy, magnesium, lithium, magnesium/silver alloy, aluminum/aluminum oxide, aluminum/lithium alloy, indium, and rare earth metals.

This cathode can be formed by making the electrode substance(s) into a thin film by vapor deposition, sputtering or some other method.

In the case where luminescence from the emitting layer is taken out through the cathode, it is preferred to make the transmittance of the cathode to the luminescence larger than 10%.

The sheet resistance of the cathode is preferably several hundreds $\Omega/\square$ or less, and the film thickness thereof is usually from 10 nm to 1 µm, preferably from 50 to 200 nm.

(10) Insulating Layer

In the organic EL device, pixel defects based on leakage or a short circuit are easily generated since an electric field is applied to the super thin film. In order to prevent this, it is preferred to insert an insulative thin layer between the pair of electrodes.

Examples of the material used in the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide.

A mixture or laminate thereof may be used.

(11) Example of the Production of the Organic EL Device

The organic EL device can be produced by forming an anode, an emitting layer, an electron-injection suppressing layer and an electron injecting layer, optionally forming a hole injecting layer and an electron injecting layer, and further forming a cathode by use of the materials and methods exemplified above. The organic EL device can be produced in the order reverse to the above, i.e., the order from a cathode to an anode.

An example of the method for producing the organic EL device shown in FIG. 1 (transparent substrate/anode/hole injecting layer/emitting layer/electron-injection-suppressing layer/electron injecting layer/cathode) will be described.

First, a thin film made of an anode material is formed into a thickness of 1 µm or less, preferably 10 to 200 nm on an appropriate transparent substrate 11 by vapor deposition, sputtering or some other method, thereby forming an anode 12.

Next, a hole injecting layer 13 is formed on this anode 12. The hole injecting layer 13 can be formed by vacuum deposition, spin coating, casting, LB technique, or some other method. Vacuum deposition is preferred since an uniform film is easily obtained and pinholes are not easily generated.

In the case where the hole injecting layer 13 is formed by vacuum deposition, conditions for the deposition vary depending on the used compound (the material for the hole injecting layer), the crystal structure or recombining structure of the hole injecting layer, and others. In general, the conditions are appropriately selected from the following: deposition source temperatures of 50 to 450° C., vacuum degrees of $10^{-7}$ to $10^{-3}$ torr, vapor deposition rates of 0.01 to 50 nm/second, substrate temperatures of −50 to 300° C., and film thicknesses of 5 nm to 5 µm.

Next, an emitting layer 14 is disposed on the hole injecting layer 13. The emitting layer 14 can be formed by using a desired organic luminescent material and making the material into a thin film by vacuum deposition, sputtering, spin coating, casting or some other method. Vacuum deposition is preferred since an uniform film is easily obtained and pinholes are not easily generated. In the case where the emitting layer 14 is formed by vacuum deposition, conditions for the deposition, which vary dependently on the used compound, can be generally selected from conditions similar to those for the hole injecting layer.

Next, an electron-injection-suppressing layer 15 is disposed on the emitting layer. The layer 15 can be formed by using a desired organic material into a thin film by vacuum deposition, sputtering, spin coating, casting or some other method. Like the hole injecting layer 13 and the emitting layer 14, vacuum deposition is preferred since an uniform film is obtained. Conditions for the deposition can be selected from conditions similar to those for the hole injecting layer 13 and the emitting layer 14.

Next, an electron injecting layer 16 is formed on the electron-injection-suppressing layer 15. Conditions for the formation can also be selected from conditions as mentioned above.

Lastly, a cathode 17 is stacked thereon to obtain an organic EL device.

The cathode 17 is made of a metal, and vapor deposition or sputtering may be used. However, vacuum deposition is preferred in order to protect underlying organic layers from being damaged when the cathode film is formed.

For the production of the organic EL device, it is preferred that the formation from the anode to the cathode is continuously carried out, using only one vacuuming operation.

The method for forming each of the layers in the organic EL element of the invention is not limited to the above method. A forming method known, such as vacuum deposition or spin coating, can be used. The organic thin film layers can be formed by vacuum deposition, molecular beam deposition (MBE method), or a known method of applying a solution wherein one or more organic compounds are dissolved in a solvent, such as dipping, spin coating, casting, bar coating or roll coating.

The film thickness of each of the organic layers in the organic EL element is not particularly limited. In general, defects such as pinholes are easily generated when the film thickness is too small. Conversely, a high applied voltage becomes necessary with a reduced efficiency when the film thickness is too large. Usually, therefore, the film thickness is preferably in the range of several nanometers to one micrometer.

(12) Others

In the case where a DC voltage is applied to the organic EL element, luminescence can be observed when the polarity of the anode and that of the cathode are made positive and negative, respectively, and the voltage of 2 to 40 V is applied. Even if a voltage is applied thereto in the state that the polarities are reverse to the above, no electric current flows so that luminescence is not generated at all. In the case where an AC voltage is applied thereto, uniform luminescence can be observed only when the polarity of the anode and that of the cathode are made positive and negative, respectively. The waveform of the AC to be applied may be arbitrarily selected.

EXAMPLES

While Examples of the invention will be explained in detail hereinafter, the invention shall not be limited to these Examples.

Compounds used in the examples and devices fabricated in the examples were evaluated for properties by the following methods.

(1) Affinity Level: Calculated from a difference between an ionization potential and an energy gap.

Ionization potentials were measured with a photoelectron spectroscopy apparatus (AC-1, manufactured by Riken Keiki Co., Ltd.). Specifically, a material was irradiated with light, and a quantity of electrons that were generated by charge separation during the irradiation was measured.

An energy gap was measured from the absorption edge of absorption spectrum in benzene. Specifically, absorption spectrum was measured with a visible light-ultraviolet spectrophotometer (U-3410, Hitachi, Ltd), and the energy gap was calculated from a wavelength at which the spectrum rised.

(2) Electron mobility—hole mobility: Measured with a TIME OF FLIGHT measuring apparatus (TOF-301, Optel).

(3) Luminance: Measured with a spectral radiance meter (CS-1000, MINOLTA Co., Ltd.).

(4) x,y of Chromaticity coordinate CIE1931: Measured with the spectral radiance meter described in (3).

(5) Luminous efficiency (L/J):L/J is a ratio of a luminance to a current density. A current and voltage were measured with a SOURCE MEASURE UNIT 236 (manufactured by KEITHLEY) and at the same time a luminance was measured with a spectral radiance meter. A current density was calculated from a current value and an emission area, and L/J was calculated.

(6) Electric power conversion efficiency η: Calculated on the basis of the following equation.

$$\eta = \pi \times (L/J)/V$$

wherein π is a ratio of circumference of a circle to its diameter, L/J is a luminous efficiency and V is a voltage.

The compounds used in Examples are shown below. Table 1 shows the electron mobilities and affinity (Af) levels of compounds used in an electron injecting layer, an electron-injection-suppressing layer or an emitting layer among these compounds.

TABLE 1

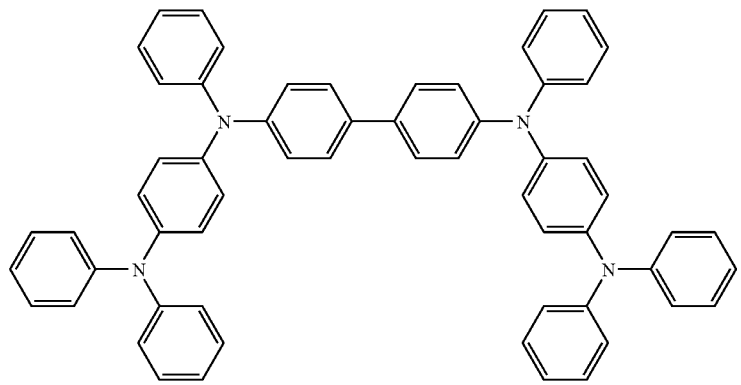

TPD232

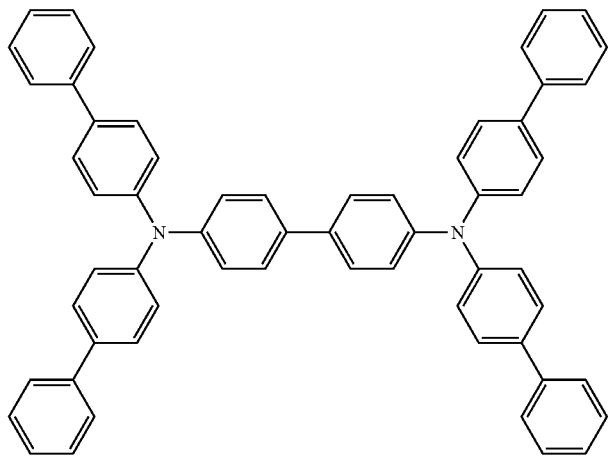

TBDB

TABLE 1-continued
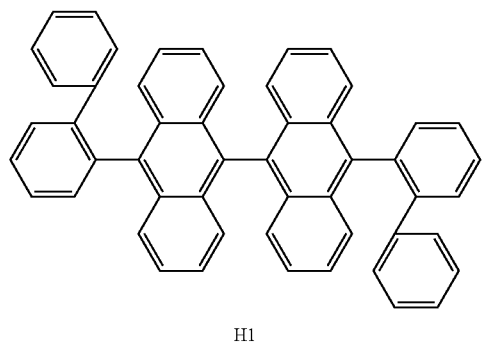
H1
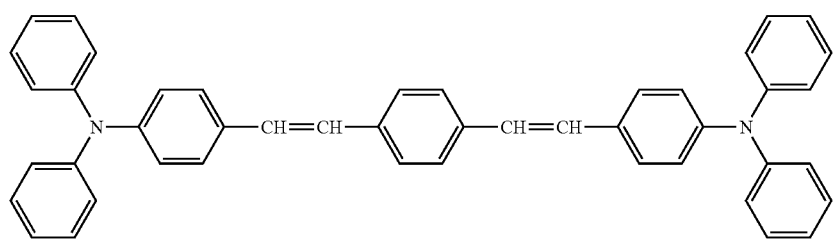
D1
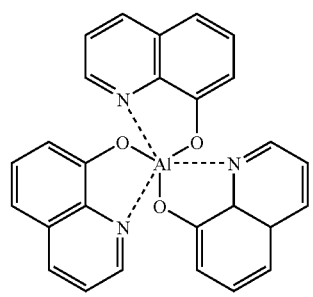
Alq
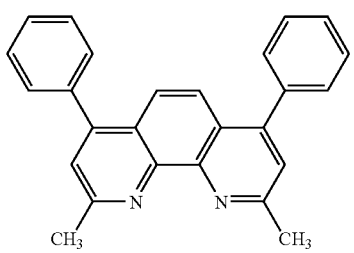
BCP

TABLE 1-continued
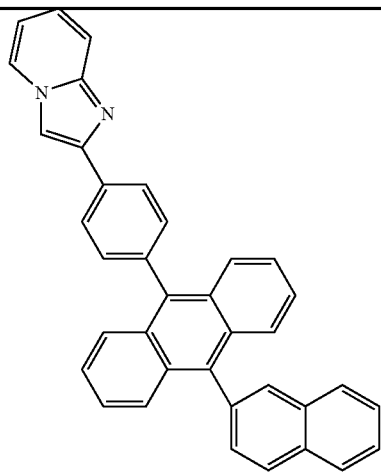
ET1
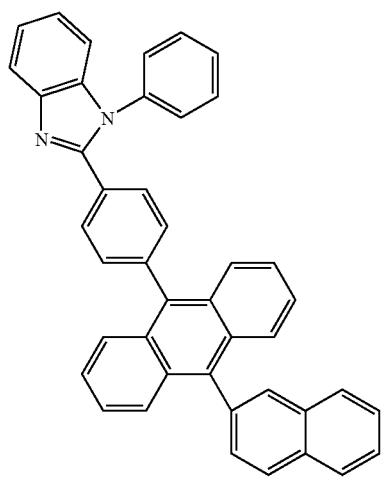
ET2
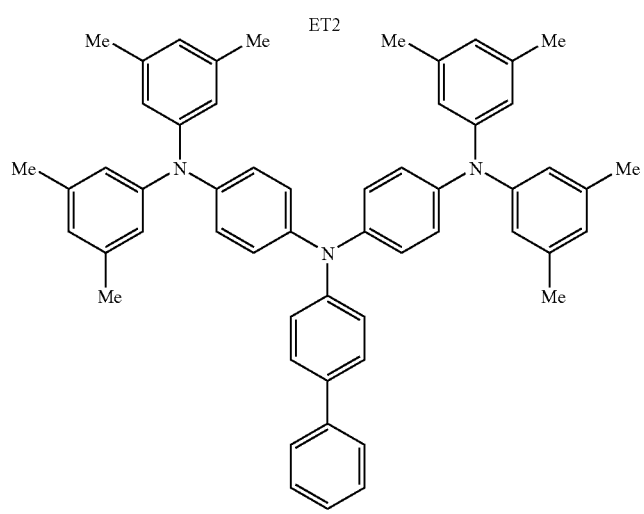
TPD787
| Compound | Alq | ET1 | ET2 | BCP | H1 | D1 |
|---|---|---|---|---|---|---|
| Electron Mobility ($cm^2/V \cdot S$) | $10^{-5}$ | $10^{-4}$ | $10^{-5}$ | $10^{-4}$ | — | — |
| Affinity Level (eV) | 3.0 | 2.75 | 2.9 | 3.0 | 2.7 | 2.8 |

Example 1

A glass substrate, 25 mm×75 mm×1.1 mm thick, having an ITO transparent electrode (manufactured by Geomatics Co.) was subjected to ultrasonic cleaning in isopropyl alcohol for 5 minutes and then in distilled water having an electrical resistance of 20 MΩm for 5 minutes, and further ultrasonic cleaning in isopropyl alcohol for 5 minutes. The resultant substrate was removed and dried.

Immediately thereafter, the substrate was subjected to UV ozone cleaning for 30 minutes with an UV ozone device manufactured by Opto Films Lab.

The cleaned glass substrate with transparent electrode lines was set up on a substrate holder in a vacuum deposition device. The inside of the device was vacuumed to $1 \times 10^{-5}$ Pa.

Next, a N'-bis(N,N'-diphenyl-4-aminophenyl)-N,N-diphenyl-4,4'-diamino-1,1'-biphenyl film (abbreviated to the "TPD 232 film" hereinafter) was formed in thickness of 60 nm at a deposition rate of 0.1 nm/sec on the surface on which the transparent electrode lines were formed, so as to cover the transparent electrode. This TPD 232 film functioned as a hole injecting layer.

Then an N,N,N',N'-tetra(4-biphenyl)-diaminobiphenylene layer (abbreviated to the "TBDB layer" hereinafter) having a thickness of 20 nm was formed on the TPD 232 film at a deposition rate of 0.1 nm/sec. This film functioned as a hole transporting layer.

Furthermore, a host material H1 was deposited at a deposition rate of 0.2 nm/sec to a 40 nm thick film.

A dopant D1 was deposited as a luminescent molecule at a deposition rate of 0.01 nm/sec simultaneously. This layer functioned as an emitting layer.

A 7 nm thick Alq film was formed as an electron-injection-suppressing layer at a deposition rate of 0.1 nm/sec on the emitting layer.

Furthermore, ET1 was deposited as an electron injecting layer at a deposition rate of 0.1 nm/sec to form a 13 nm thick film.

Lithium fluoride, LiF was deposited at a deposition rate of 0.01 nm/sec to form a 1 nm thick film. Metal Al was deposited thereon at a deposition rate of 0.8 nm/sec to form a metallic cathode, thereby forming an organic EL device.

The device was measured for an initial performance. The results were 13 cd/A, $CIE_{x,y}=(0.16, 0.25)$ and a driving voltage of 4.0 V at a current density of 1 mA/cm². Table 2 shows the results.

TABLE 2

| | Driving Voltage at 1 mA/cm² (V) | Luminous Efficiency L/J (cd/A) | Chromaticity Coodinate $CIE_{x,y}$ | Power Conversion Efficiency (1 m/W) |
|---|---|---|---|---|
| Ex. 1 | 4.0 | 13 | 0.16, 0.25 | 10.2 |
| Ex. 2 | 4.0 | 13 | 0.16, 0.26 | 10.2 |
| Com. Ex. 1 | 2.8 | 8 | 0.16, 0.26 | 9.0 |
| Com. Ex. 2 | 3.0 | 9 | 0.16, 0.26 | 9.4 |
| Ex. 3 | 4.0 | 13 | 0.16, 0.26 | 10.2 |
| Ex. 4 | 5.5 | 13 | 0.16, 0.26 | 7.4 |
| Com. Ex. 3 | 5.0 | 10 | 0.16, 0.26 | 6.3 |

Example 2

An organic EL device was produced in the same manner as in Example 1 except that BCP was used as a material of an electron injecting layer, Cs was simultaneously co-deposited with an alkali dispenser manufactured by Saes getter Co., Ltd. and a lithium fluoride layer was not formed. Table 2 shows the evaluation of the device.

Comparative Example 1

An organic EL device was produced in the same manner as in Example 1 except that an Alq film of electron-injection-suppressing layer was not formed and the thickness of an ET1 film of electron injecting layer was changed to 20 nm. Table 2 shows the evaluation of the device.

The driving voltage of the device decreased since it did not have an electron-injection-suppressing layer, compared with the device of Example 1. However, the L/J efficiency remarkably decreased since electrons were excessive. Thus the device of Example 1 was superior in power conversion efficiency indicating the total efficiency of a device.

The device was one-several-tenths the device of Example 1 in half life of luminance.

Comparative Example 2

An organic EL device was produced in the same manner as in Example 2 except that an Alq film of electron-injection-suppressing layer was not formed and the thickness of a BCP film of electron injecting layer was changed to 20 nm. Table 2 shows the evaluation of the device.

The driving voltage of the device decreased since it did not have an electron-injection-suppressing layer, compared with the device of Example 2. However, the L/J efficiency remarkably decreased since electrons were excessive. Thus the device of Example 2 was superior in power conversion efficiency indicating the total efficiency of a device.

The device was one-several-tenths the device of Example 2 in half life of luminance.

Example 3

An organic EL device was produced in the same manner as in Example 1 except that ET2 was used as an electron-injection-suppressing layer instead of Alq, the thickness thereof was changed to 10 nm and the thickness of an ET1 film of electron injecting layer was changed to 10 nm.

Example 4

An organic EL device was produced in the same manner as in Example 1 except that a hole-injection-suppressing layer was formed of TPD787 instead of the hole-injection-suppressing layer made of TPD232, a TBDB layer was similarly formed thereon to form a hole injecting layer, an electron injecting layer made of ET1 was not formed, and the thickness of an Alq layer was changed to 20 nm and used as an electron injecting layer. Table 2 shows the evaluation of the device.

The hole mobility of TPD232 is $10^{-4}$ cm²/V·s, that of TPD787 is $10^{-8}$ cm²/V·s, and that of TBDB is $10^{-3}$ cm²/V·s.

Comparative Example 3

An organic EL device was produced in the same manner as in Example 1 except that an electron injecting layer made of ET1 was not formed, and the thickness of an Alq layer was changed to 20 nm and used as an electron injecting layer. Table 2 shows the evaluation of the device.

In this device, the driving voltage increased compared with the device of Comparative Example 3 since TPD787, the hole mobility of which was smaller than that of TPD232, was used. However the L/J efficiency was enhanced and the device of Example 4 was then superior in power conversion efficiency indicating the total efficiency of a device. This results confirmed the effect of the hole-injection-suppressing layer.

INDUSTRIAL UTILITY

The invention provides an organic EL device with an improved luminous efficiency.

The invention claimed is:

1. An organic electroluminescent device comprising:
an emitting layer between a pair of electrodes that are an anode and a cathode, and
an electron injecting layer and an electron-injection-suppressing layer between the cathode and the emitting layer, the electron injecting layer in contact with the electron-injection-suppressing layer, the electron-injection-suppressing layer for regulating the amount of electrons supplied to the emitting layer,
the electron mobility of the electron-injection-suppressing layer being smaller than the electron mobility of the electron injecting layer,
the electron mobility of the electron injecting layer being greater than the electron mobility of tris(8-quinolinolato)aluminum, and
the electron injecting layer comprising a nitrogen-containing cyclic compound.

2. The organic electroluminescent device according to claim 1, wherein the affinity level (Af1) of the emitting layer, the affinity level (Af2) of the electron-injection-suppressing layer and the affinity level (Af3) of the electron injecting layer satisfy the following relationship, $Af1 < Af2, Af3 \leq Af2$.

3. The organic electroluminescent device according to claim 1, wherein the electron-injection-suppressing layer comprises a nitrogen-containing cyclic compound.

4. The organic electroluminescent device according to claim 1, wherein the emitting layer emits blue light.

5. A display that comprises a screen comprising the organic electroluminescent device of claim 1.

6. The organic electroluminescent device according to claim 1, wherein the thickness of the electron-injection-suppressing layer is 5 nm to 1 µm.

7. The organic electroluminescent device according to claim 1, wherein the thickness of the electron-injection-suppressing layer is 7 nm to 1 µm.

8. The organic electroluminescent device according to claim 1, wherein the electron-injection-suppressing layer comprises a metal complex of 8-hydroxyquinoline or its derivative.

9. The organic electroluminescent device according to claim 1, wherein the emitting layer and the electron-injection-suppression layer are in contact with each other.

* * * * *